(12) United States Patent
Tseng

(10) Patent No.: US 11,967,378 B2
(45) Date of Patent: Apr. 23, 2024

(54) ANALOG CONTENT ADDRESSABLE MEMORY DEVICE, ANALOG CONTENT ADDRESSABLE MEMORY CELL AND METHOD FOR DATA SEARCHING AND COMPARING THEREOF

(71) Applicant: MACRONIX INTERNATIONAL CO., LTD., Hsinchu (TW)

(72) Inventor: Po-Hao Tseng, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 142 days.

(21) Appl. No.: 17/830,427

(22) Filed: Jun. 2, 2022

(65) Prior Publication Data
US 2023/0395148 A1 Dec. 7, 2023

(51) Int. Cl.
*G11C 15/04* (2006.01)
(52) U.S. Cl.
CPC .................... *G11C 15/04* (2013.01)
(58) Field of Classification Search
CPC ..... G11C 15/04; G11C 7/16; G06F 16/90339; G06F 12/0864
See application file for complete search history.

(56) References Cited

U.S. PATENT DOCUMENTS

| 6,757,779 B1* | 6/2004 | Nataraj ............ H03K 3/356139 |
| | | 711/108 |
| 2021/0327508 A1* | 10/2021 | Li ......................... G11C 15/04 |
| 2021/0343341 A1* | 11/2021 | Strachan ............. G11C 15/046 |
| 2023/0377651 A1* | 11/2023 | Chiang .................. G11C 15/04 |

\* cited by examiner

*Primary Examiner* — Ajay Ojha
(74) *Attorney, Agent, or Firm* — McClure, Qualey & Rodack, LLP

(57) ABSTRACT

The application discloses an analog content addressable memory (CAM) device, an analog CAM cell and a method for data searching and comparing thereof. The CAM cell includes: a first memory cell and a second memory cell coupled to each other, wherein the analog CAM cell stores analog storage data which is corresponding to a match range, the match range is determined based on first and second threshold voltages of the analog CAM cell; an analog search data is converted into first and second analog search voltages; the first and the second memory cells receive the first and the second analog search voltages; and the analog CAM memory cell generates a memory cell current, or the analog CAM memory cell keeps or discharges a match line voltage on a match line coupled to the analog CAM memory cell.

15 Claims, 16 Drawing Sheets

200A

200B

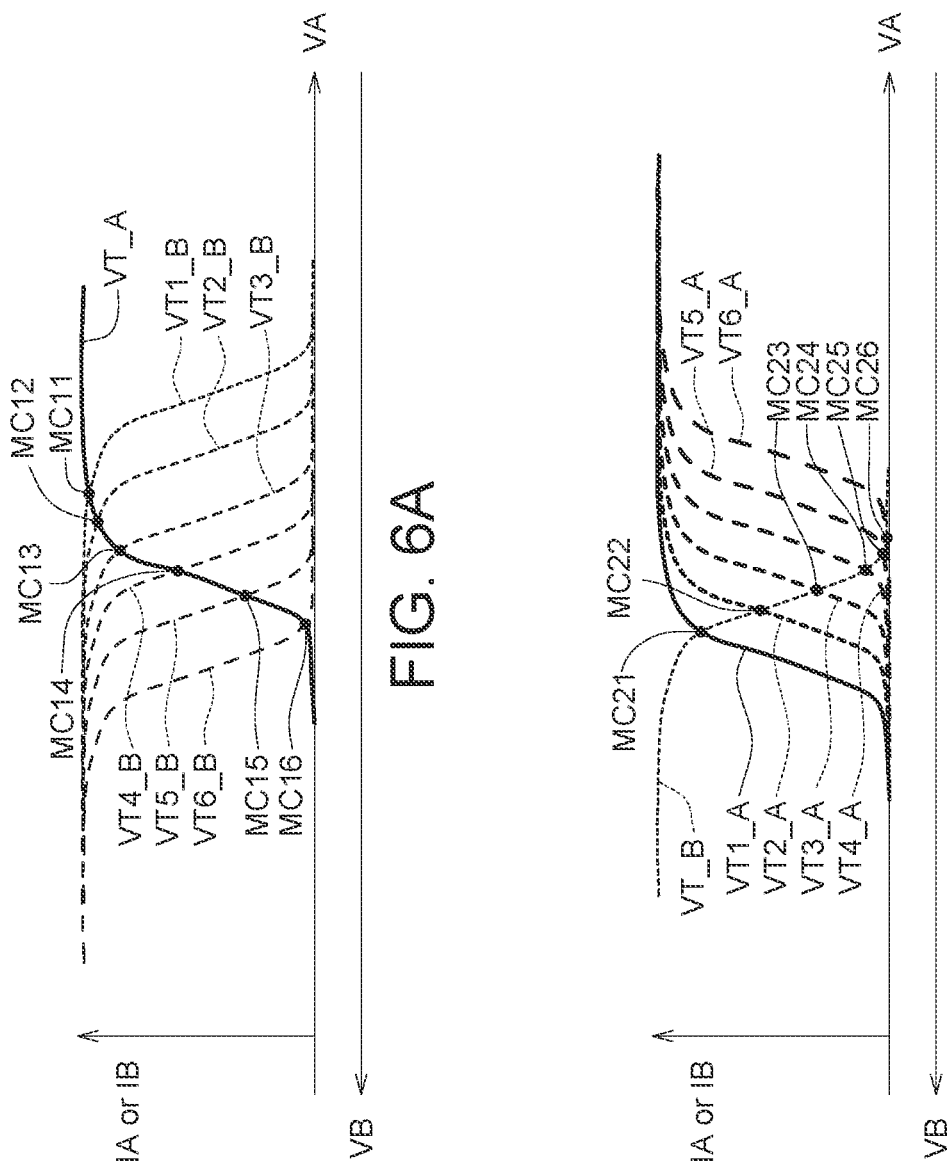

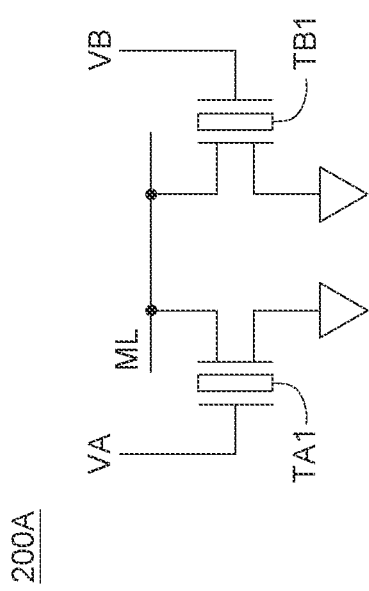
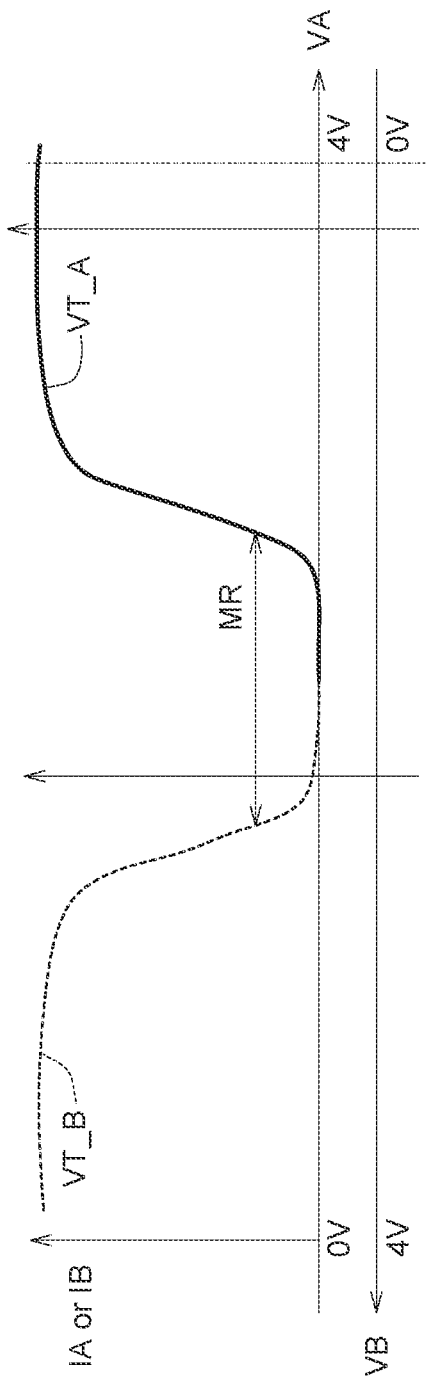
FIG. 7

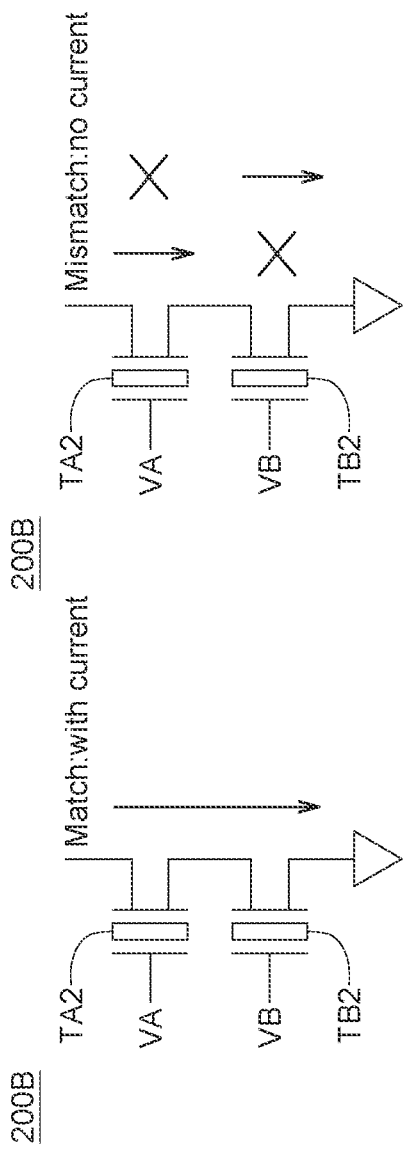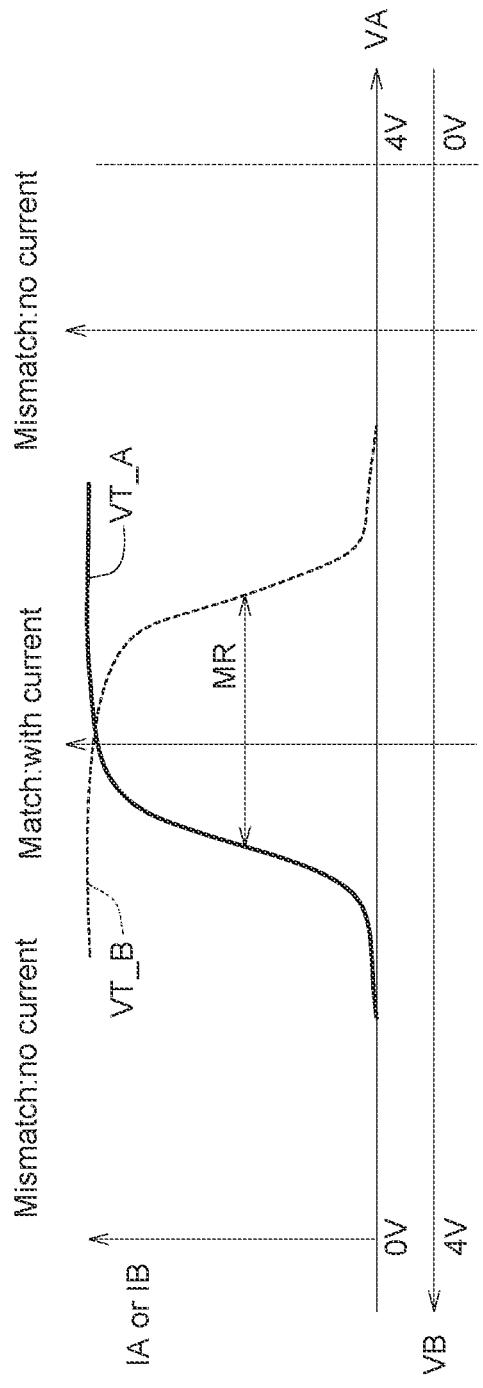
FIG. 8

ANALOG CONTENT ADDRESSABLE MEMORY DEVICE, ANALOG CONTENT ADDRESSABLE MEMORY CELL AND METHOD FOR DATA SEARCHING AND COMPARING THEREOF

TECHNICAL FIELD

The disclosure relates in general to an analog content addressable memory (CAM) device, an analog CAM cell and a method for data searching and comparing thereof, and more particularly to an analog content addressable memory (CAM) device, an analog CAM cell and a method for data searching and comparing thereof for implementing analog in-memory approximate searching.

BACKGROUND

Along with rise of big data and artificial intelligent (AI) hardware accelerator, data search and data comparison are important functions. The current content addressable memory (CAM) may implement highly parallel searching.

A content-addressable memory (CAM) compares a search data against storage data in a highly parallel manner.

Analog CAM can store wide intervals of continuous levels, thereby enhancing search and matching functionality in the analog domain. Moreover, analog CAM can significantly increase data density, reduce power consumption and require less circuit.

FIG. 1 shows operations diagram for analog CAM and digital CAM. As shown in FIG. 1, the digital CAM stores digital data and digital search data searches the digital storage data stored in the digital CAM. The analog CAM stores analog continuous values and analog continuous search data searches the analog storage data stored in the analog CAM.

Thus, there needs an analog Content Addressable Memory (CAM) device, an analog CAM cell and a method for data search and comparison, which searches analog storage data stored in the analog CAM device and the analog CAM cell by analog search data.

SUMMARY

According to one embodiment, an analog content addressable memory (CAM) device is provided. The CAM device includes: a plurality of analog CAM cells, the analog CAM cells storing a plurality of analog storage data, wherein the plurality of analog storage data of the analog CAM cells are corresponding to a plurality of match ranges, the match ranges are determined based on a plurality of first threshold voltages and a plurality of second threshold voltages of the analog CAM cells; and an electrical characteristic detection circuit coupled to the analog CAM cells. Wherein, in data searching, an analog search data is converted into a first analog search voltage and a second analog search voltage; the first analog search voltage and the second analog search voltage are compared with the match ranges of the analog CAM memory cells; the analog CAM memory cells generate a plurality of memory cell currents; and the electrical characteristic detection circuit detects the memory cell currents to generate a plurality of sensing results, or the electrical characteristic detection circuit detects a plurality of match line voltages on a plurality of match lines coupled to the analog CAM memory cells to generate the plurality of search results.

According to another embodiment, a data searching and comparing method for an analog content addressable memory (CAM) device is provided. The data searching and comparing method includes: converting an analog search data into a first analog search voltage and a second analog search voltage; comparing the first analog search voltage and the second analog search voltage with a plurality of match ranges of a plurality of analog CAM memory cells, wherein a plurality of analog storage data of the analog CAM cells are converted into the match ranges, the match ranges are determined based on a plurality of first threshold voltages and a plurality of second threshold voltages of the analog CAM cells; generating a plurality of memory cell currents from the analog CAM memory cells; and detecting the memory cell currents to generate a plurality of sensing results, or detecting a plurality of match line voltages on a plurality of match lines coupled to the analog CAM memory cells to generate the plurality of search results.

According to an alternative embodiment, an analog content addressable memory (CAM) cell is provided. The CAM cell includes: a first memory cell and a second memory cell coupled to each other, wherein the analog CAM cell stores analog storage data; the analog storage data of the analog CAM cell is corresponding to a match range, the match range is determined based on a first threshold voltage and a second threshold voltage of the first memory cell and the second memory cell; an analog search data is converted into a first analog search voltage and a second analog search voltage; the first memory cell and the second memory cell receive the first analog search voltage and the second analog search voltage; and the analog CAM memory cell generates a memory cell current, or the analog CAM memory cell keeps or discharges a match line voltage on a match line coupled to the analog CAM memory cell.

BRIEF DESCRIPTION OF THE DRAWINGS

FIG. 6A and FIG. 6B show the match current according one embodiment of the application.

FIG. 7 shows a match range according to one embodiment of the application.

FIG. 8 shows a match range according to one embodiment of the application.

Figure 1:
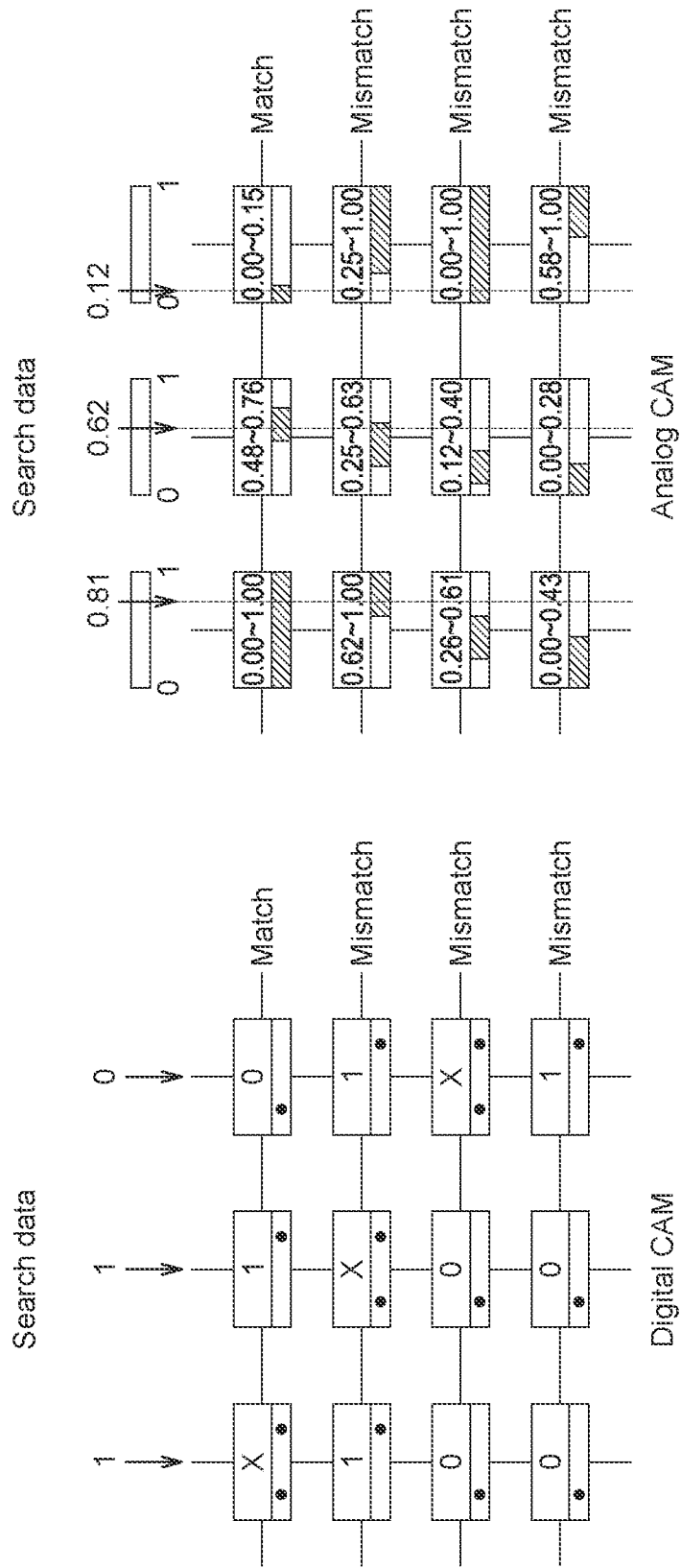
FIG. 1 shows operations diagram for analog CAM and digital CAM.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

One embodiment of the application discloses an analog content addressable memory (CAM) device, an analog CAM cell and a method for data searching and comparing thereof for implementing analog in-memory approximate searching. By adjusting threshold voltages of the analog CAM cells, different match ranges are created.

Figure 2A:
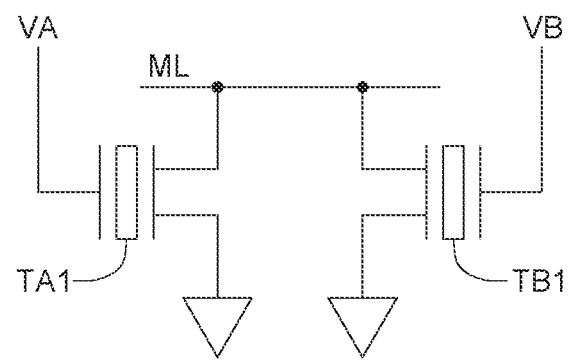
FIG. 2A shows a circuit structure of an analog CAM cell according to one embodiment of the application.
Figure 2B:
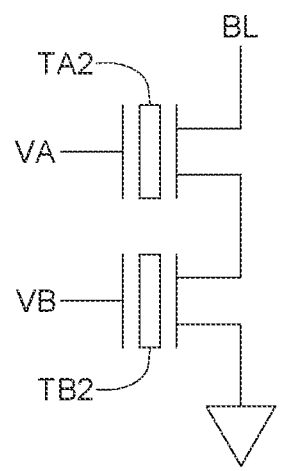
FIG. 2B shows a circuit structure of an analog CAM cell according to another embodiment of the application.

FIG. 2A shows a circuit structure of an analog CAM cell according to one embodiment of the application. FIG. 2B shows a circuit structure of an analog CAM cell according to another embodiment of the application.

As shown in FIG. 2A, the analog CAM cell 200A according to one embodiment of the application includes two memory cells TA1 and TB1 coupled in parallel. The memory cell TA1 includes: a gate for receiving a first analog search voltage VA; a first terminal coupled to a match line ML; and a second terminal coupled to ground (GND). The memory cell TB1 includes: a gate for receiving a second analog search voltage VB; a first terminal coupled to the match line ML; and a second terminal coupled to ground (GND). In here, the memory cells TA1 and TB1 are NMOS transistors, but the application is not limited by this. The first analog search voltage VA and the second analog search voltage VB are input into the memory cells TA1 and TB1 via different word lines. The analog CAM cell 200A in FIG. 2A may be for example but not limited by, implemented in NOR type memory device.

As shown in FIG. 2B, the analog CAM cell 200B according to one embodiment of the application includes two memory cells TA2 and TB2 coupled in serially. The memory cell TA2 includes: a gate for receiving a first analog search voltage VA; a first terminal coupled to a bit line BL (or coupled to a previous analog CAM cell 200B); and a second terminal coupled to the memory cell TB2. The memory cell TB2 includes: a gate for receiving a second analog search voltage VB; a first terminal coupled to the second terminal of the memory cell TA2; and a second terminal coupled to ground (GND) or to a next analog CAM cell 200B. In here, the memory cells TA2 and TB2 are NMOS transistors, but the application is not limited by this. The first analog search voltage VA and the second analog search voltage VB are input into the memory cells TA2 and TB2 via different word lines. The analog CAM cell 200B in FIG. 2BA may be for example but not limited by, implemented in NAND type memory device.

Figure 3A:
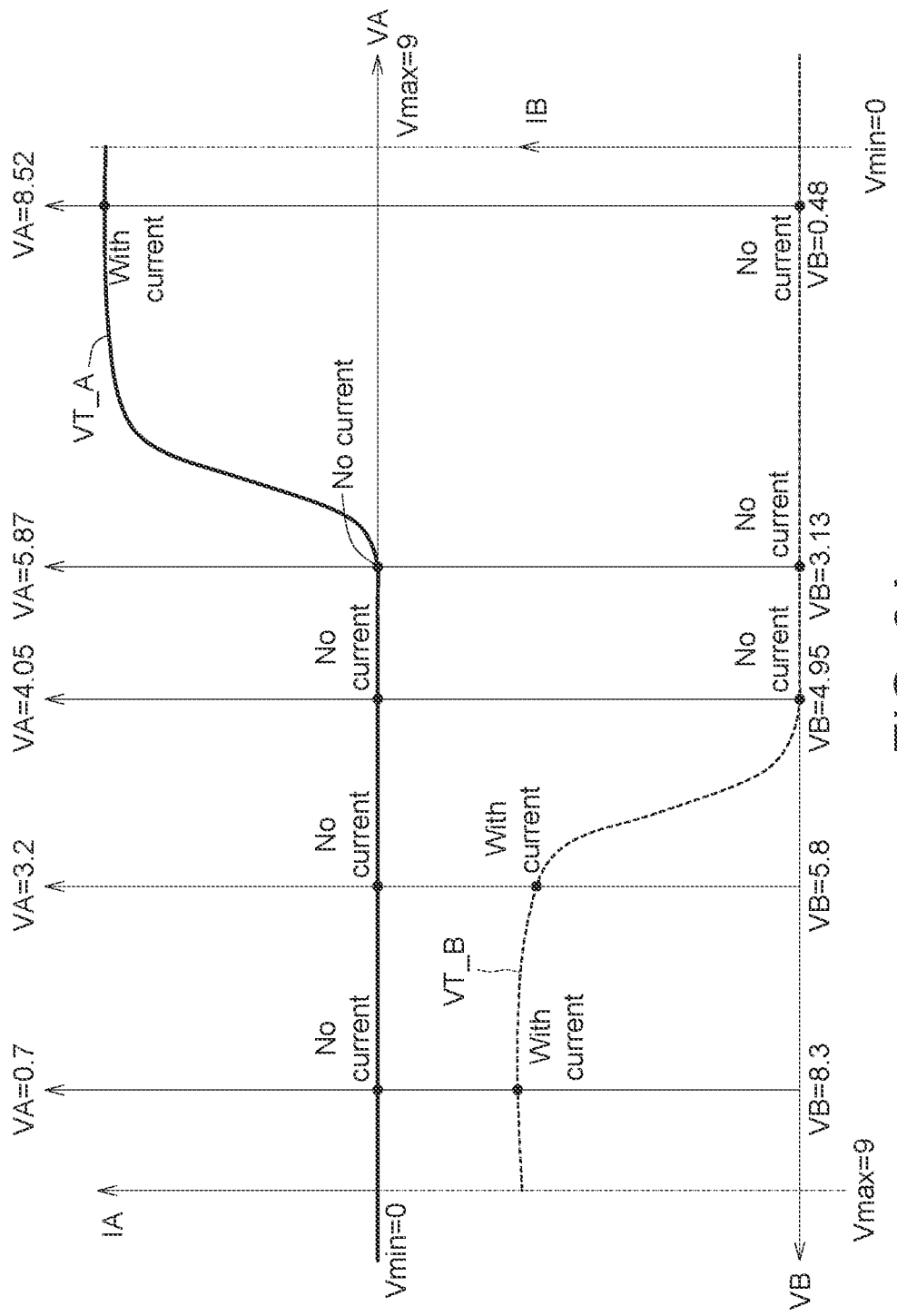
FIG. 3A shows a voltage-current curve of the analog CAM cell according to one embodiment of the application.

FIG. 3A shows a voltage-current curve of the analog CAM cell 200A or 200B according to one embodiment of the application. In FIG. 3A, the threshold voltage of the memory cell TA is marked as VT_A (or referred as the first threshold voltage); and the threshold voltage of the memory cell TB is marked as VT_B (or referred as the second threshold voltage). The threshold voltages VT_A and VT_B are independently programmed to arbitrary threshold voltage values if needed. The memory cell TA may be the memory cell TA1 or TA2; and the memory cell TB may be the memory cell TB1 or TB2.

The channel current IA refers to the channel current flowing through the memory cell TA. The channel current 1B refers to the channel current flowing through the memory cell TB.

In one embodiment of the application, the first analog search voltage VA and the second analog search voltage VB has a relationship for example but not limited by: VB=Vmax+Vmin−VA. Vmax and Vmin refer to an analog search voltage maximum value and an analog search voltage minimum value, respectively, which are both constant values. For example but not limited by, Vmax=9V and Vmin=0V.

In one embodiment of the application, when the analog search voltage minimum value Vmin is higher than or equal to 0V, both the first analog search voltage VA and the second analog search voltage VB are positive; when the analog search voltage maximum value Vmax is lower than or equal to 0V, both the first analog search voltage VA and the second analog search voltage VB are negative; and when the analog search voltage maximum value Vmax is higher than 0V and the analog search voltage minimum value Vmin is lower than 0V, one of the first analog search voltage VA and the second analog search voltage VB is positive while the other of the first analog search voltage VA and the second analog search voltage VB is negative.

As shown in FIG. 3A, when VA=0.7V and VB=8.3V, the memory cell TA does not provide the memory cell current but the memory cell TB provides the memory cell current. When VA=4.05V and VB=4.95V, neither the memory cell TA nor the memory cell TB provides the memory cell current. When VA=8.52V and VB=0.48V, the memory cell TA provides the memory cell current but the memory cell TB does not provide the memory cell current.

Figure 3B:
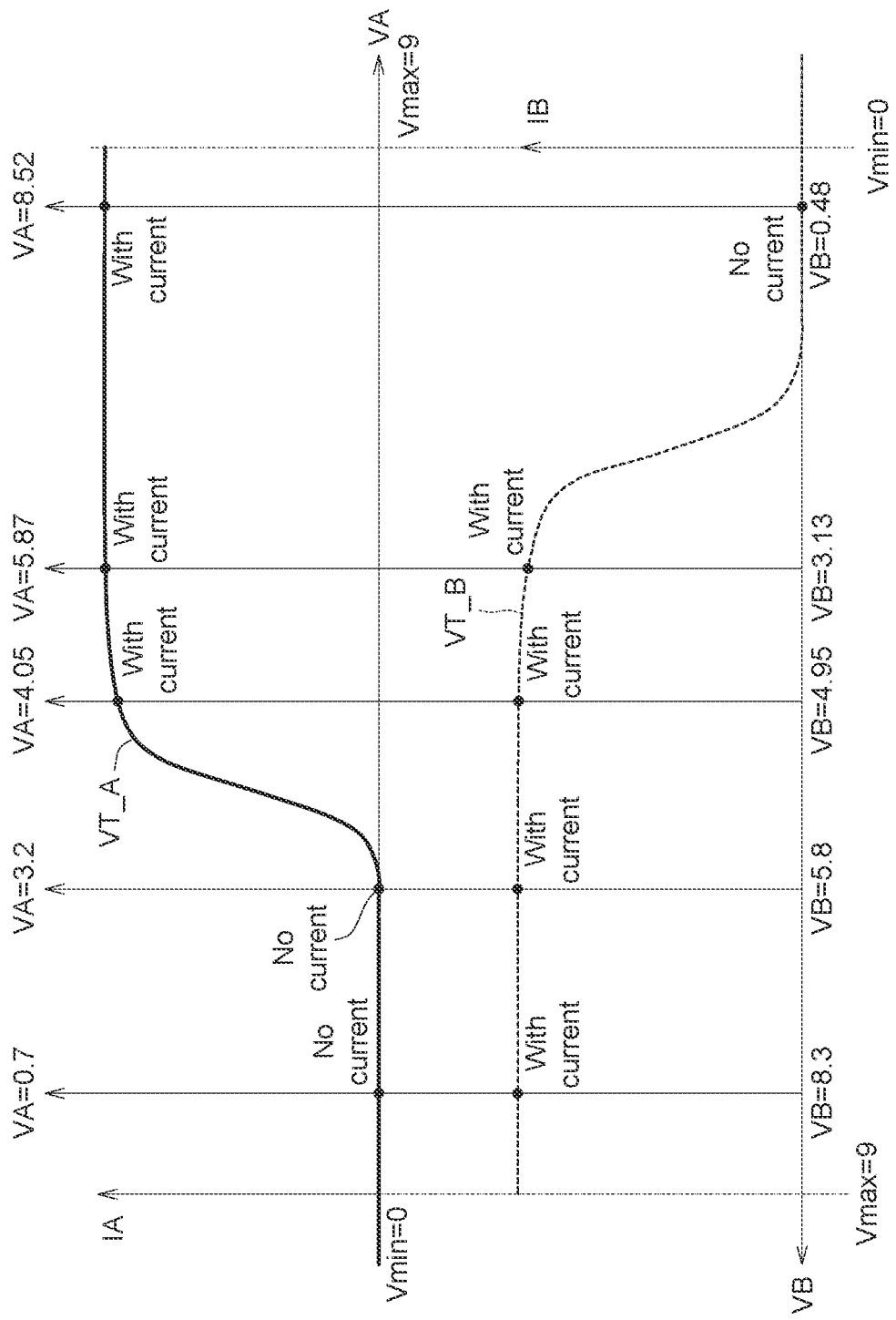
FIG. 3B shows another voltage-current curve of the analog CAM cell according to one embodiment of the application.

FIG. 3B shows another voltage-current curve of the analog CAM cell 200A or 200E according to one embodiment of the application. The threshold voltages VT_A and VT_B in FIG. 3B are lower than the threshold voltages VT_A and VT_B in FIG. 3A.

As shown in FIG. 3B, when VA=0.7V and VB=8.3V, neither the memory cell TA nor the memory cell TB provides the memory cell current. When VA=4.05V and VB=4.95V, both the memory cell TA and the memory cell TB provide the memory cell current. When VA=8.52V and VB=0.48V, the memory cell TA provides the memory cell current but the memory cell TB does not provide the memory cell current.

Figure 4:
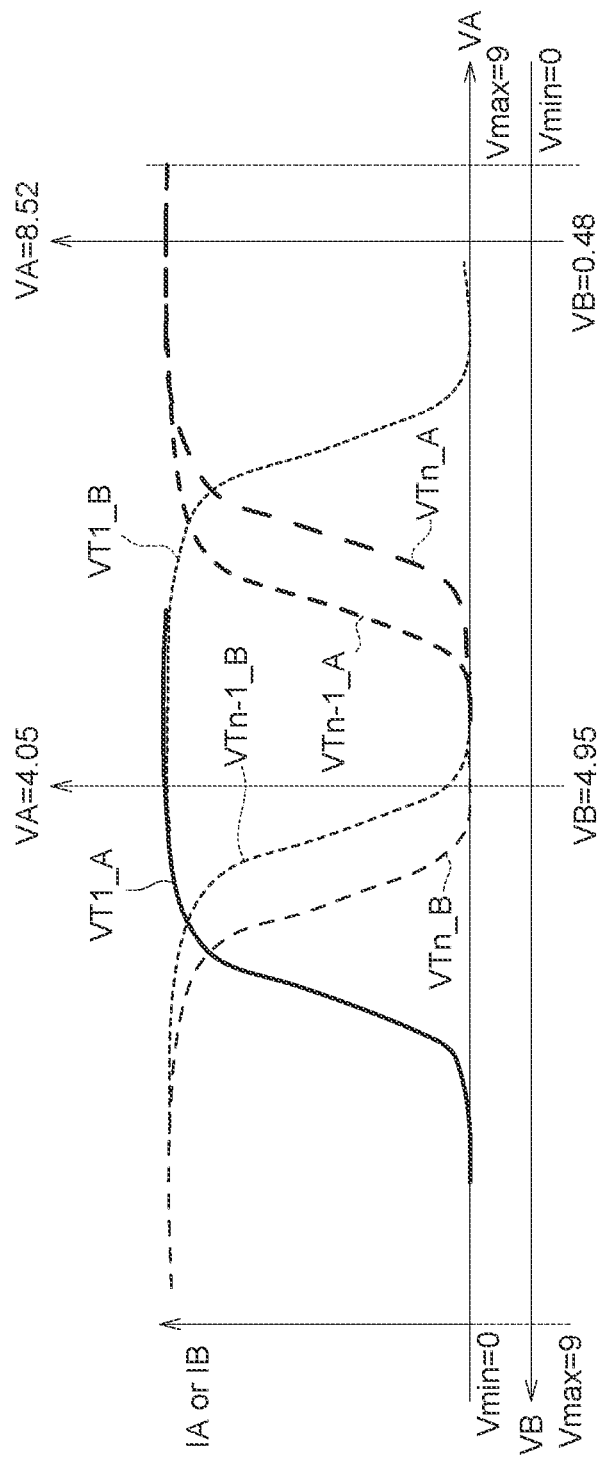
FIG. 4 shows a match range according to one embodiment of the application.

FIG. 4 shows a match range according to one embodiment of the application. In one embodiment of the application, the match range is determined based on the voltage-current relationship (i.e. the voltage-current curve) of the memory cell TA and the voltage-current relationship (i.e. the voltage-current curve) of the memory cell TB. In one embodiment of the application, the match range is corresponding to the analog storage data of the analog CAM cell 200A/200B. For example but not limited by, the analog storage data of the analog CAM cell 200A/200B is converted into the match range. The match range is determined based on the first threshold voltage of the memory cell TA and the second threshold voltage of the memory cell TB of the analog CAM cell 200A or 200B.

The analog storage data D has an analog storage data range between an analog storage data minimum Amin and an analog storage data maximum Dmax. For example but not limited by, in one embodiment of the application, the analog storage data D of the analog CAM cell 200A/200B is between 0.00(Dmin)~1.00(Dmax). In one embodiment of the application, via encoding, the analog storage data minimum Dmin and the analog storage data maximum Dmax are encoded into the threshold voltage minimum VTmin and the threshold voltage maximum VTmax, respectively. That is, the threshold voltage minimum VTmin and the threshold voltage maximum VTmax are determined based on the analog storage data minimum Dmin and the analog storage data maximum Dmax. The threshold voltages of the memory cells TA and TB are between the threshold voltage minimum VTmin and the threshold voltage maximum VTmax.

Further, the analog search data S has an analog search data range between the analog search data minimum Smin and the analog search data maximum Smax. For example but not limited by, in one embodiment of the application, the analog search data S which may be used in searching the analog CAM cell 200A/200B are between 0.00(Smin)~1.00(Smax). In one embodiment of the application, by encoding, the analog search data minimum Smin and the analog search data maximum Smax are encoded into the analog search voltage minimum Vmin and the analog search voltage maximum Vmax, respectively. After encoding, the analog search data S is converted into the first analog search voltage VA and the second analog search voltage VB. The first analog search voltage VA and the second analog search voltage VB are continuous values. The first analog search voltage VA is between the analog search voltage minimum Vmin and the analog search voltage maximum Vmax and VB=Vmax+Vmin−VA.

In FIG. 4, the voltage-current curves are corresponding to the threshold voltages VT1_A~VTn_A and VT1_B~VTn_B. VT1_A~VTn_A indicate different n threshold voltages of the memory cell TA (n being a positive Integer): and VT1_B~VTn_B indicate different n threshold voltages of the memory cell TB. Wherein, VT1_A< VT2_<. . . <VTn_A and VT1_B<VT1_B<. . . <VTn_B.

The match range is determined based on the voltage-current relationship (i.e. the voltage-current curve) of the memory cell TA and the voltage-current relationship (i.e. the voltage-current curve) of the memory cell TB. For example but not limited by, when the memory cells TA and TB have threshold voltages of VT1_A and VT1_B, a match range is determined: and when the memory cells TA and TB have threshold voltages of VT2_A and VT1_B, another match range is determined.

Figure 5A:
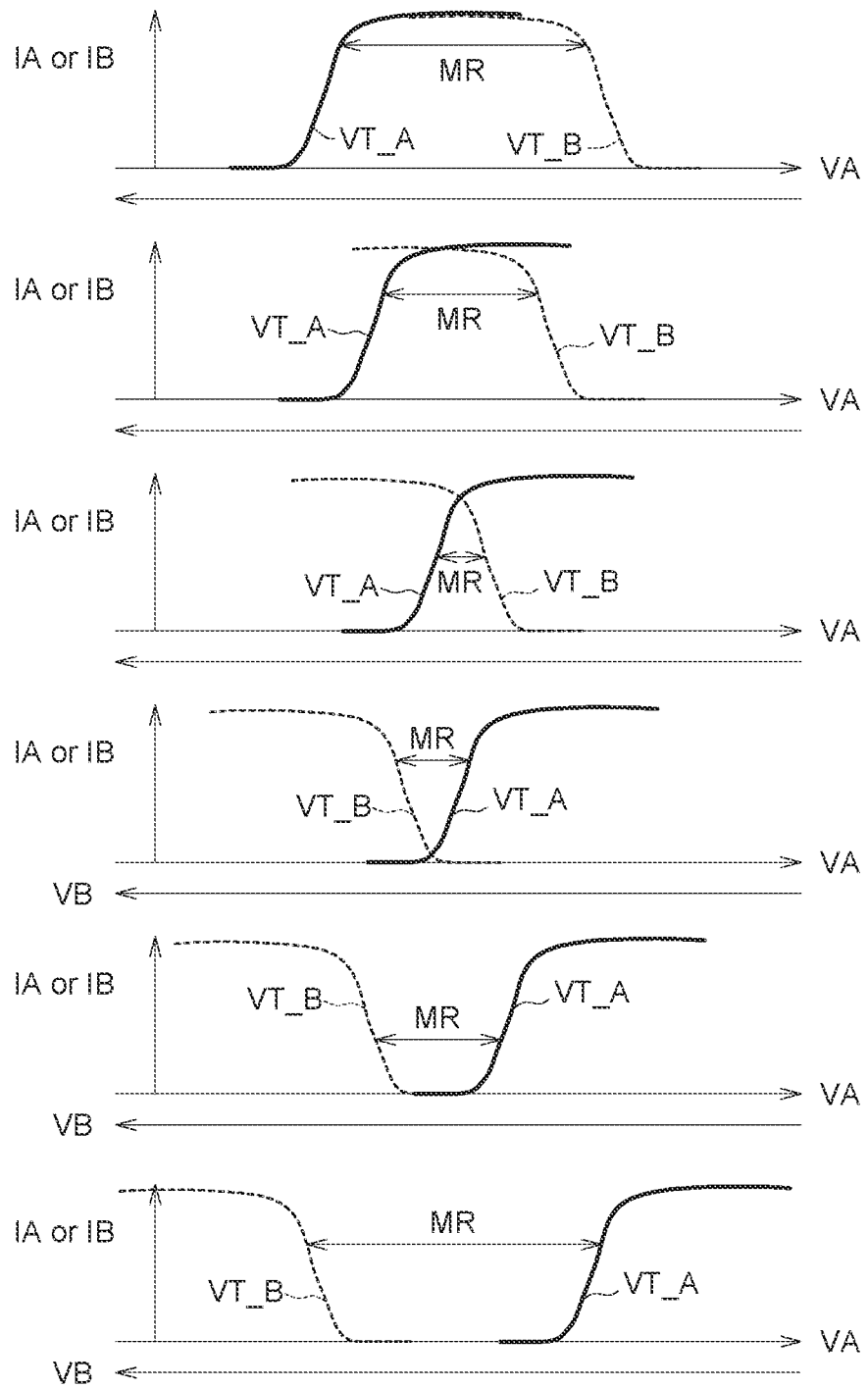
FIG. 5A to FIG. 5C show match ranges according to one embodiment of the application.
Figure 5B:
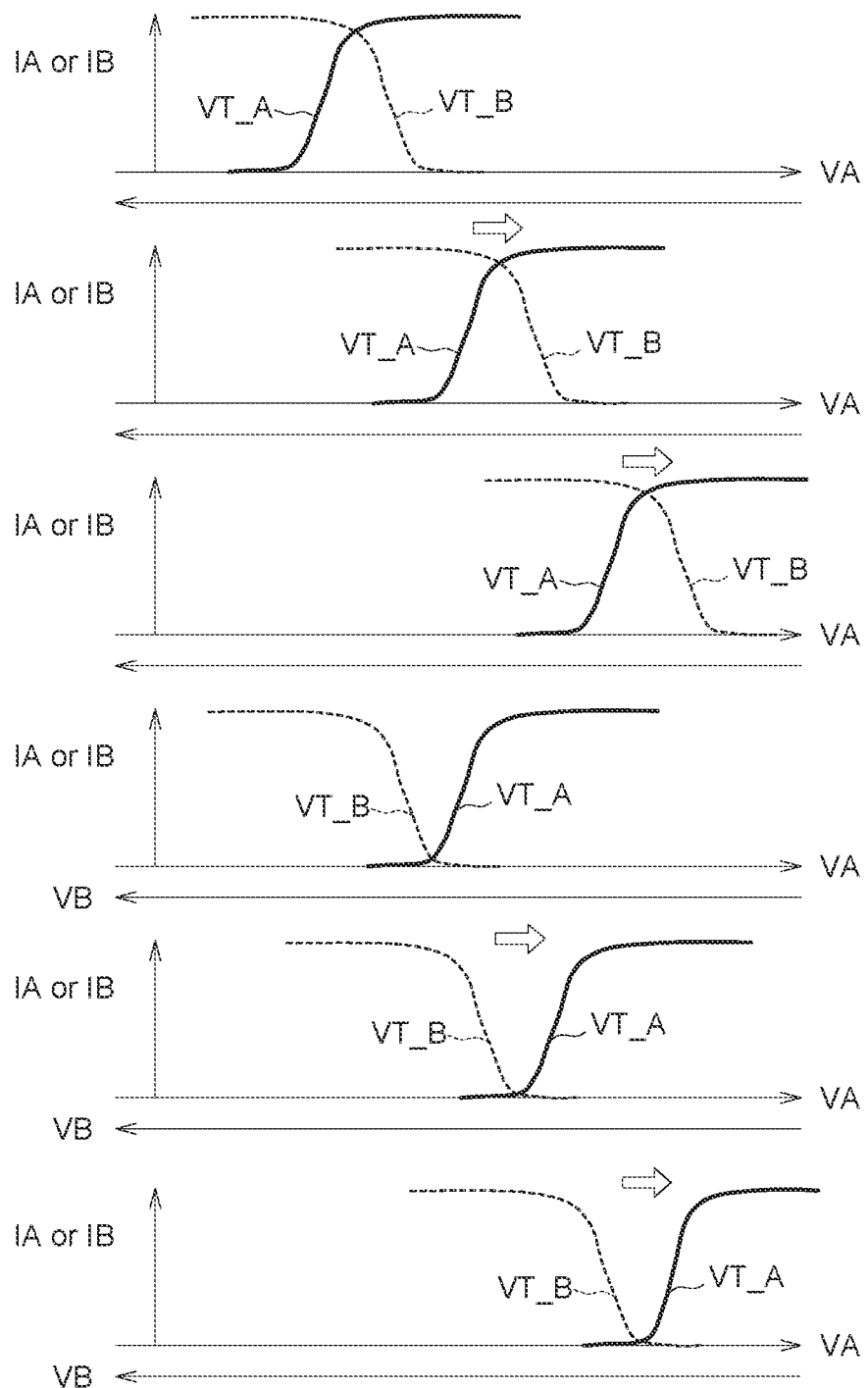
Figure 5C:
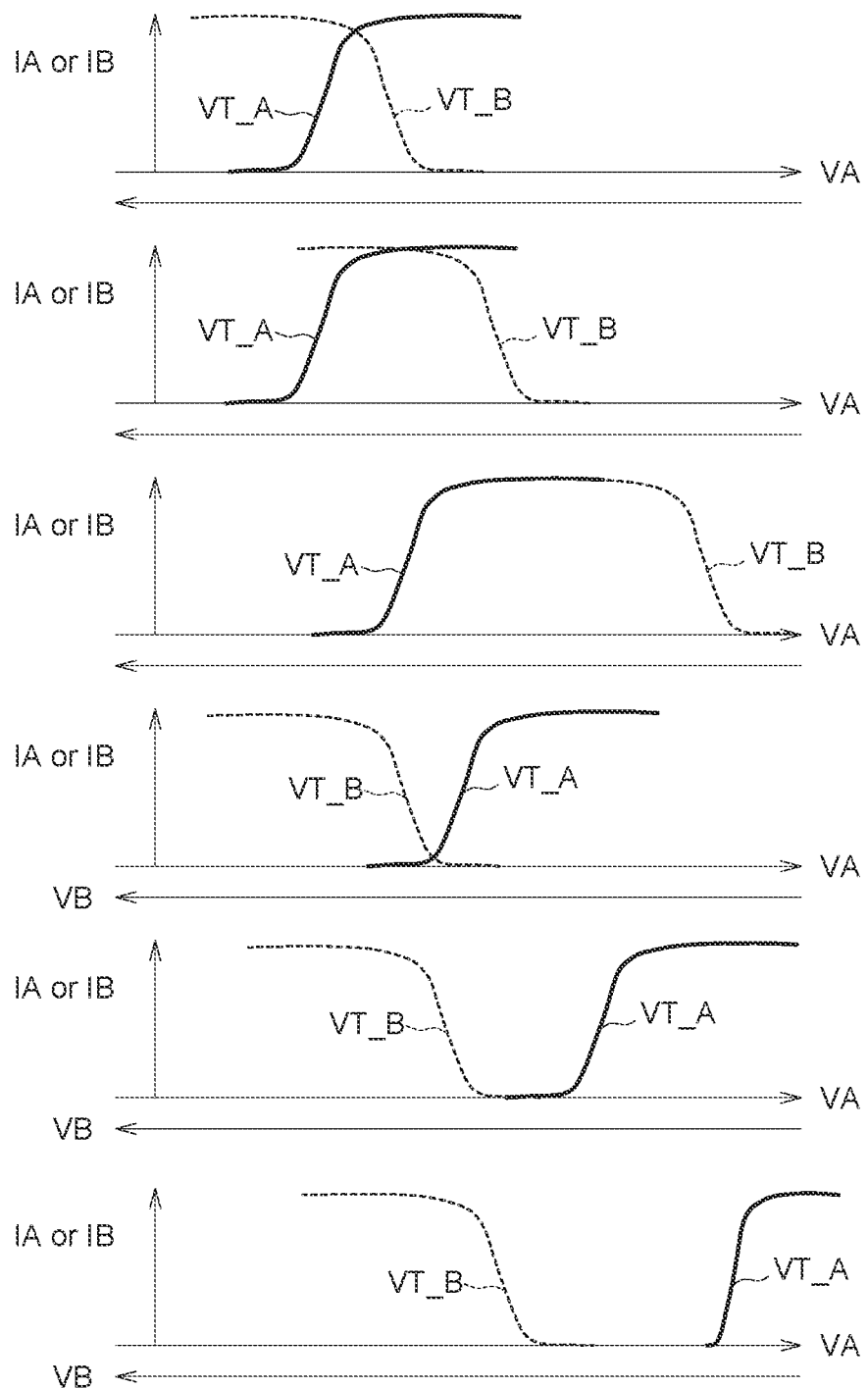

FIG. 5A to FIG. 5C show match ranges according to one embodiment of the application. In one embodiment of the application, for example but not limited by, the match range is between 1.5V~2.5V. The range width of the match range is 2.5V−1.5V=1V; and the maximum value and the minimum value of the match rage are 2.5V and 1.5V. The maximum value and the minimum value of the match rage are also referred as a position of the match range.

As shown in FIG. 5A, by changing the threshold voltages VT_A and VT_B of the memory cells TA and TB, the range width of the match range is changed. The definition of the match range MR is described later.

As shown in FIG. 5B, by changing the threshold voltages VT_A and VT_B of the memory cells TA and TB, the maximum value and the minimum value (i.e. the position) of the match range MR are changed.

As shown in FIG. 5C, by changing the threshold voltages VT_A and VT_B of the memory cells TA and TB, the range width, the maximum value and the minimum value (i.e. the position) of the match range are changed.

That is, in one embodiment of the application, by changing the threshold voltages VT_A and VT_B of the memory cells TA and TB, the range width and/or the position of the match range are changed.

FIG. 6A and FIG. 6B show the match current according one embodiment of the application. In one embodiment of the application, by changing the threshold voltages VT_A and VT_B of the memory cells TA and TB, the match current of the analog CAM cell is also changed. Here, the match current refers to that the current from the analog CAM cell when the analog search voltage matches with the match range.

As shown in FIG. 6A, when the threshold voltage of the memory cell TB are VT1_B~VT6_B (VT1_B< VT2_B< . . . <VT6_B), the match currents are MC11~MC16, respectively, wherein MC11> MC12 . . . >MC16.

As shown in FIG. 6B, when the threshold voltage of the memory cell TA are VT1_A~VT6_A (VT1_A< VT2_A< . . . <VT6_A), the match currents are MC21~MC26, respectively, wherein MC21> MC22> . . . >MC26.

That is, in one embodiment of the application, by changing the threshold voltages VT_A and VT_B of the memory cells TA and TB, the match current of the analog CAM cell is adjusted.

FIG. 7 shows a match range according to one embodiment of the application. As shown in FIG. 7, it is assumed that the maximum value and the minimum value of the first analog search voltage VA are 4V and 0V, respectively, then the second analog search voltage VB (VB=Vmax+Vmin−VA) is between 0V~4V. For example but not limited by, when the first analog search voltage VA and the second analog search voltage VB are 1.6V and 2.4V, respectively, from the voltage-current curve in FIG. 7, none of the memory cells TA1 and TB1 generates the memory cell current, which is determined as "match". Thus, the match range is defined as when none of the memory cells TA1 and TB1 generates the memory cell current.

When the first analog search voltage VA and the second analog search voltage VB are 3.7V and 0.3V, respectively, from the voltage-current curve in FIG. 7, the memory cell TA1 generates the memory cell current but the memory cell TB1 generates no any memory cell currents, which is determined as "mismatch". Alternatively, when the first analog search voltage VA and the second analog search voltage VB are 0.3V and 3.7V, respectively, from the voltage-current curve in FIG. 7, the memory cell TA1 generates no any memory cell currents but the memory cell TB1 generates the memory cell current, which is determined as "mismatch". Thus, when one of the memory cells TA1 and TB1 generates the memory cell current and the other one generates no any memory cell currents, which is defined as "mismatch". By so, the mismatch range is defined.

That is, in one embodiment of the application, when the first analog search voltage VA falls within the match range, none of the memory cells TA1 and TB1 generates the memory cell current and thus the match line voltage of the match line ML is not discharged. The match line voltage of the match line ML is kept. On the other hand, when the first analog search voltage VA falls outside the match range, at least one of the memory cells TA1 and TB1 generates the memory cell current and thus the match line voltage of the match line ML is discharged. The match line voltage of the match line ML is lowered.

As described above, in one embodiment of the application, based on whether the match line voltage of the match line ML is kept or discharged, it is determined the search result is matched or mismatched.

FIG. 8 shows a match range according to one embodiment of the application. As shown in FIG. 8, it is assumed that the maximum value and the minimum value of the first analog search voltage VA are 4V and 0V, respectively, then the second analog search voltage VB (VB=Vmax+Vmin−VA) is between 0V~4V. For example but not limited by, when the first analog search voltage VA and the second analog search voltage VB are 1.6V and 2.4V, respectively, from the voltage-current curve in FIG. 8, both the memory cells TA2 and TB2 generate the memory cell currents, which is determined as "match". Thus, the match range is defined as when both the memory cells TA2 and TB2 generate the memory cell currents.

When the first analog search voltage VA and the second analog search voltage VB are 3.7V and 0.3V, respectively, from the voltage-current curve in FIG. 8, the memory cell TA2 generates the memory cell current but the memory cell TB2 generates no any memory cell currents, which is determined as "mismatch". Alternatively, when the first analog search voltage VA and the second analog search voltage VB are 0.3V and 3.7V, respectively, from the voltage-current curve in FIG. 8, the memory cell TA2 generates no any memory cell currents but the memory cell TB2 generates the memory cell current, which is determined as "mismatch". Thus, when one of the memory cells TA2 and TB2 generates the memory cell current and the other one generates no any memory cell currents, which is defined as "mismatch".

That is, in one embodiment of the application, when the first analog search voltage VA falls within the match range, both of the memory cells TA2 and TB2 generate the memory cell currents and the analog CAM cell 200E generates the match current. On the other hand, when the first analog search voltage VA falls outside the match range, one of the memory cells TA2 and TB2 generates the memory cell current while the other one of the memory cells TA2 and TB2 generates no any memory cell currents, and the analog CAM cell 200B generates no any match currents.

As described above, in one embodiment of the application, based on whether the analog CAM cell 200B generates the match current, it is determined the search result is matched or mismatched.

Figure 9:
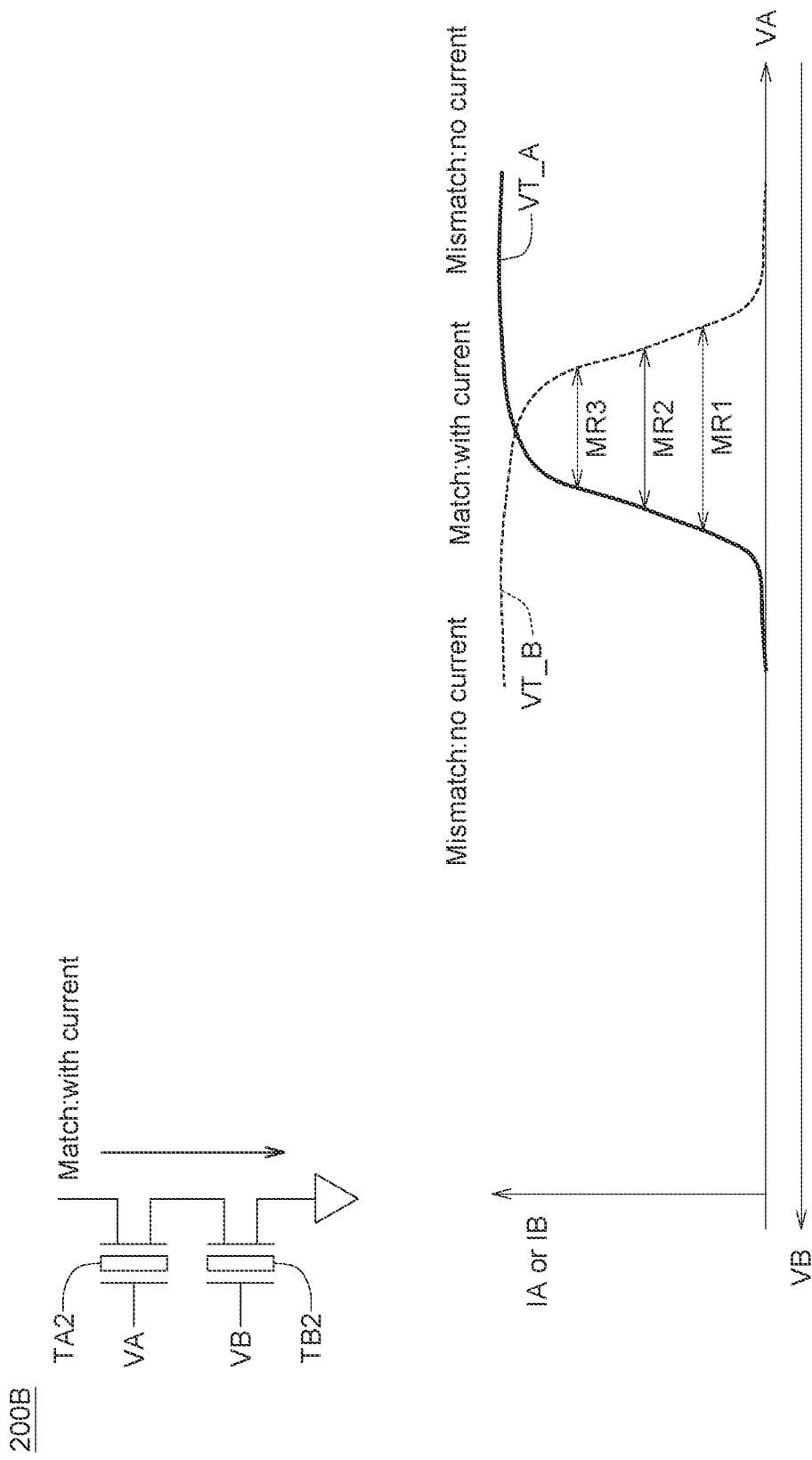
FIG. 9 shows match range adjustment according one embodiment of the application.

FIG. 9 shows match range adjustment according one embodiment of the application. As shown in FIG. 9, in one embodiment of the application, the analog CAM cell 200B is further coupled to a sensing amplifier SA. By adjusting the current sensing level of the sensing amplifier SA, the match range is adjusted. In details, when the minimum sensing current of the sensing amplifier SA is smaller, the match range is wider and vice versa. In here, the current sensing level refers to that the minimum sensing current of the sensing amplifier SA. Maximizing the current sensing level means maximizing the minimum sensing current of the sensing amplifier SA; and minimizing the current sensing level means minimizing the minimum sensing current of the sensing amplifier SA.

For example but not limited by, in FIG. 9, when the minimum sensing current of the sensing amplifier SA is about 50 µA, the match range is marked as MR1; when the minimum sensing current of the sensing amplifier SA is about 100 µA, the match range is marked as MR2; and when the minimum sensing current of the sensing amplifier SA is about 200 µA, the match range is marked as MR3. MR1>MR2>MR3.

Of course, adjusting the current sensing level of the sensing amplifier SA for adjusting the match range in FIG. 9 is also applied to the analog CAM cell 200A, which is still within the spirit and the scope of the application.

Figure 10:
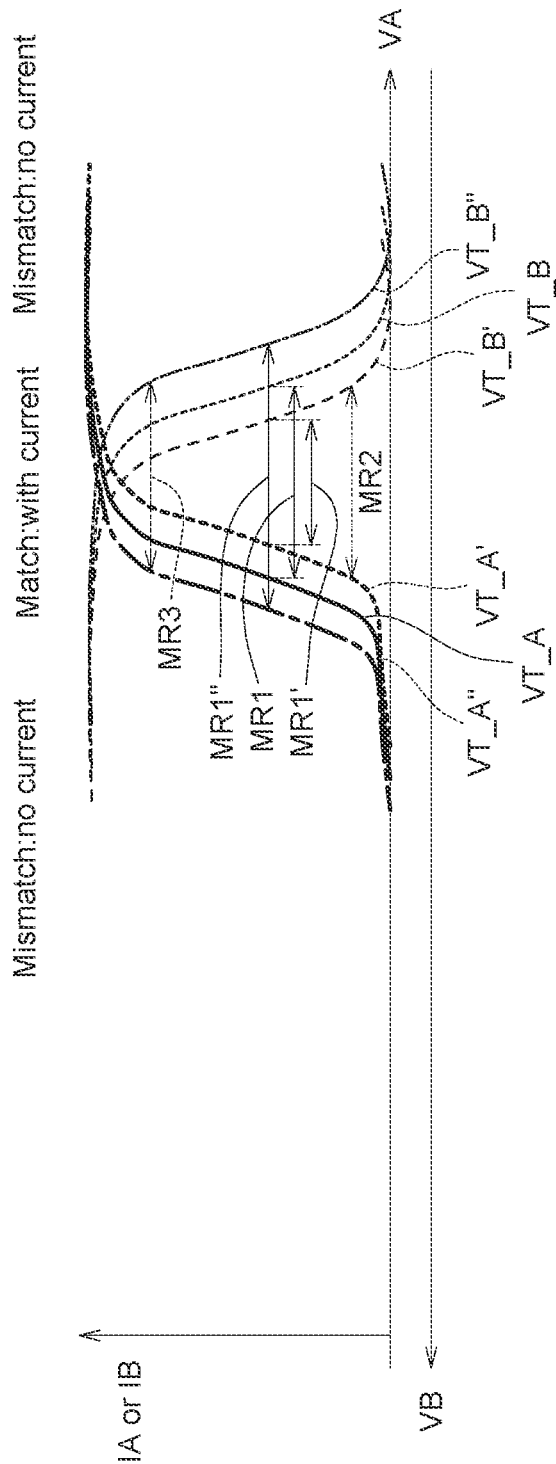
FIG. 10 shows match range adjustment for compensating the reliability according one embodiment of the application.

FIG. 10 shows match range adjustment for compensating the reliability according one embodiment of the application. As shown in FIG. 10, in one embodiment of the application, the match range is adjusted for compensating the reliability by adjusting the current sensing level of the sensing amplifier SA.

In FIG. 10, VT_A and VT_B indicate initial threshold voltages of the memory cells TA and TB, which is related to the match range MR1.

When there is any read disturbance, the threshold voltages of the memory cells TA and TB are changed from VT_A and VT_B into VT_A' and VT_B', which is related to the match range MR1' (MR1'<MR1). This means the read disturbance affects the match range. Thus, in one embodiment of the application, by minimizing the minimum sensing current of the sensing amplifier SA, the match range is adjusted from MR1' into MR2 (MR2 is about equal to MR1).

When there is any retention loss, the threshold voltages of the memory cells TA and TB are changed from VT_A and VT_B into VT_A" and VT_B", which is related to the match range MR1" (MR1">MR1). This means the retention loss affects the match range. Thus, in one embodiment of the application, by maximizing the minimum sensing current of the sensing amplifier SA, the match range is adjusted from MR1" into MR3 (MR3 is about equal to MR1).

Of course, adjusting the current sensing level of the sensing amplifier SA for adjusting the match range in FIG. 10 is also applied to the analog CAM cell 200A, which is still within the spirit and the scope of the application.

In one embodiment of the application, by adjusting the current sensing level of the sensing amplifier SA, the match range is adjusted for compensating the reliability.

Figure 11:
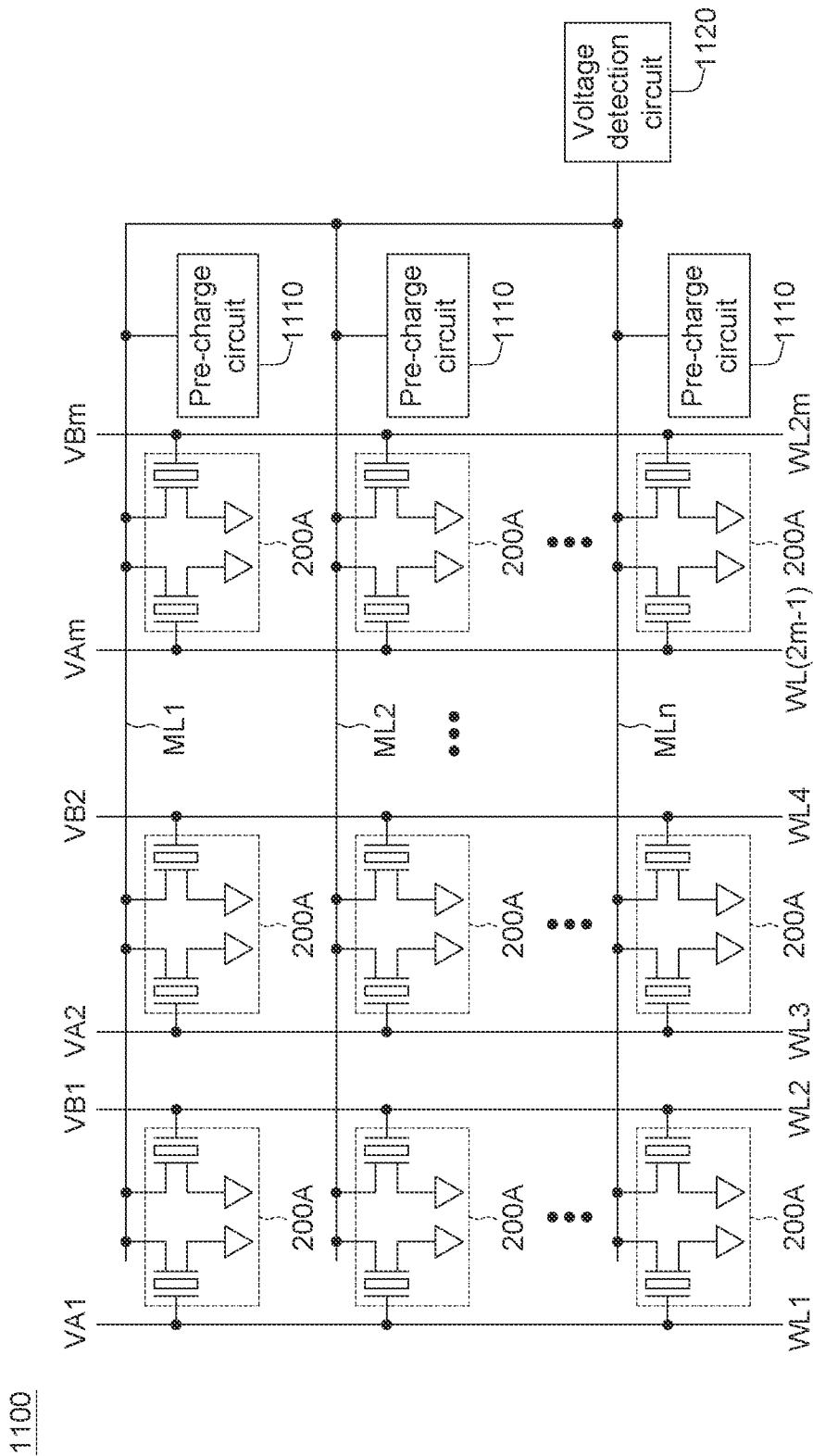
FIG. 11 shows a diagram of a memory device according to one embodiment of the application.

FIG. 11 shows a diagram of a memory device according to one embodiment of the application. As shown in FIG. 11, the memory device 1100 according to one embodiment of the application includes: a plurality of analog CAM cells, a plurality of word lines, a plurality of match lines, a plurality of pre-charge circuits 1100 and a voltage detection circuit 1120.

The memory device 1100 is for example but not limited by, NOR type memory device. The analog CAM cells may be the analog CAM cells 200A. FIG. 11 shows the word lines WL1~WL2m and the match lines ML1~MLn which is not to limit the application.

The analog CAM cells are coupled to the word lines and the match lines.

The first analog search voltages VA1~VAm and the second analog search voltages VB1~VBm are input into the analog CAM cells via the word lines WL1~WL2m.

The pre-charge circuits 1110 are coupled to the match lines ML1~MLn. In beginning of the search, the pre-charge circuits 1110 pre-charge the match lines ML1~MLn.

The voltage detection circuit 1120 is coupled to the match lines ML1~MLn for detecting whether a plurality of match line voltages of the match lines MlL~MLn are kept or discharged. Based on the detection result of the voltage detection circuit 1120, it is determined whether the first analog search voltages VA1~VAm and the second analog search voltages VB1~VBm match with the analog storage data of the analog CAM cells or not.

For example, based on the detection result of the voltage detection circuit 1120, the match line voltage of the match line MD is kept and the match lines of the other match lines ML2~MLm are discharged, which indicates that the first analog search voltages VA1~VAm and the second analog search voltages VB1~VBm match with the analog storage data of the analog CAM cells on the first row (coupled to the match line ML1).

Figure 12:
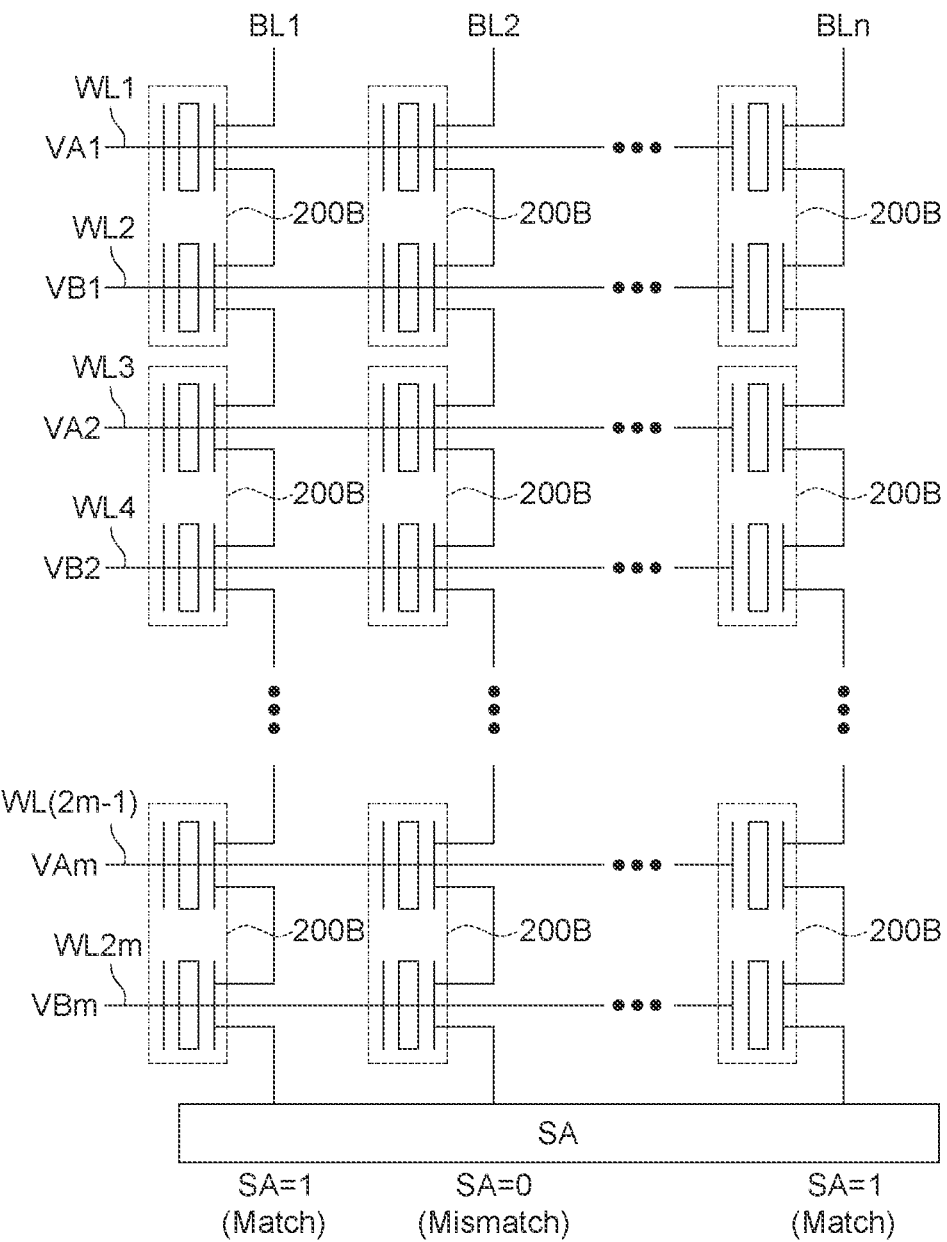
FIG. 12 shows a diagram of a memory device according to one embodiment of the application.

FIG. 12 shows a diagram of a memory device according to one embodiment of the application. As shown in FIG. 11, the memory device 1200 according to one embodiment of the application includes: a plurality of analog CAM cells, a plurality of word lines, a plurality of bit lines and a sensing amplifier SA.

The memory device 1200 is for example but not limited by, NAND type memory device. The analog CAM cells may be the analog CAM cells 200B. FIG. 12 shows the word lines WL1~WL2$m$ and the bit lines BL1~BLn which is not to limit the application.

The analog CAM cells are coupled to the word lines and the bit lines.

The first analog search voltages VA1~VAm and the second analog search voltages VB1~VBm are input into the analog CAM cells via the word lines WL1~WL2$m$.

The sensing amplifier SA is coupled to the analog CAM cells for sensing whether the analog CAM cells on the same string (the same column) generate the match current or not, to determine whether the first analog search voltages VA1~VAm and the second analog search voltages VB1~VBm match with the analog storage data of the analog CAM cells or not.

For example, based on the sensing result of the sensing amplifier SA, it is determined that which string (which column) of the analog CAM cells match with the first analog search voltages VA1~VAm and the second analog search voltages VB1~VBm. For example, when the sensing amplifier SA senses that the first string (the first column) and the n-th string (the n-th column) of the analog CAM cells generate the match currents, then it is determined that the first string (the first column) and the n-th string (the n-th column) of the analog CAM cells match with the first analog search voltages VA1~VAm and the second analog search voltages VB1~VBm.

Figure 13:
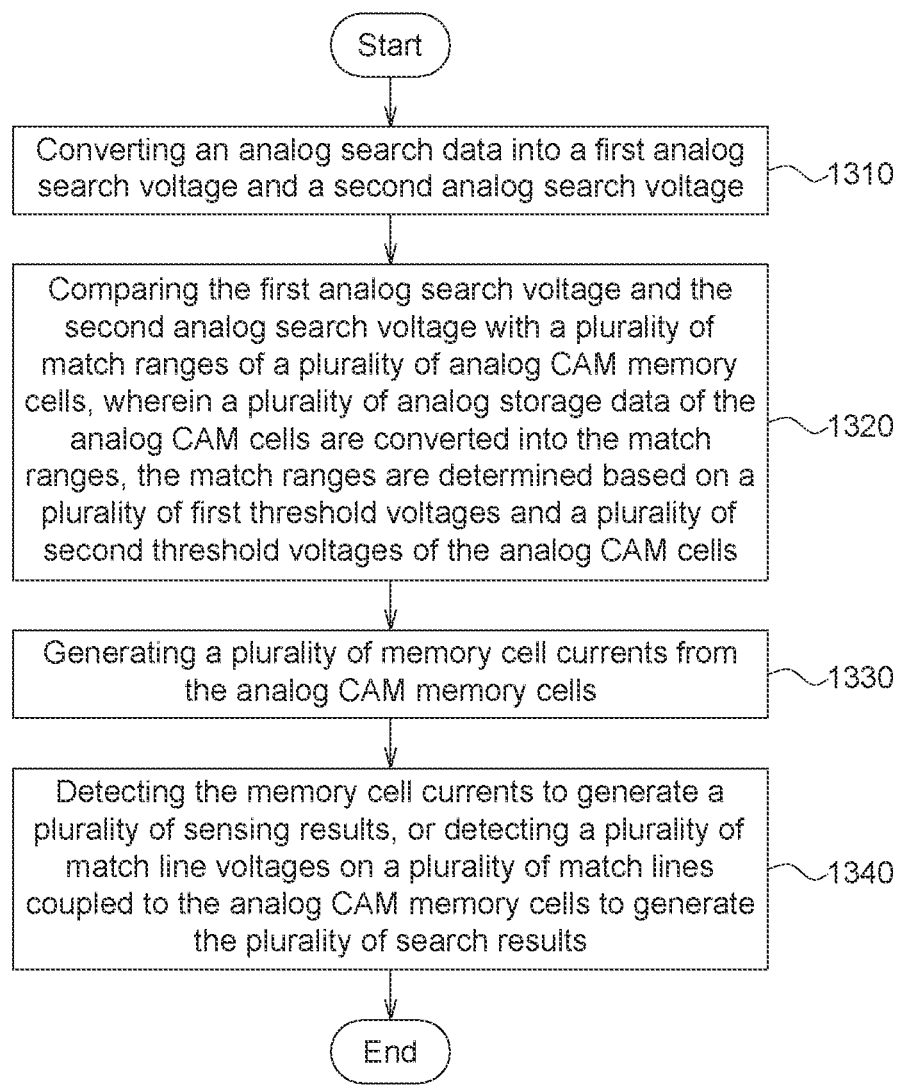
FIG. 13 shows a flow chart of a data searching and comparing method for an analog content addressable memory (CAM) device according to one embodiment of the application.

FIG. 13 shows a flow chart of a data searching and comparing method for an analog content addressable memory (CAM) device according to one embodiment of the application. The data searching and comparing method includes: converting an analog search data into a first analog search voltage and a second analog search voltage (1310); comparing the first analog search voltage and the second analog search voltage with a plurality of match ranges of a plurality of analog CAM memory cells (1320), wherein a plurality of analog storage data of the analog CAM cells are converted into the match ranges, the match ranges are determined based on a plurality of first threshold voltages and a plurality of second threshold voltages of the analog CAM cells; generating a plurality of memory cell currents from the analog CAM memory cells (1330); and detecting the memory cell currents to generate a plurality of sensing results, or detecting a plurality of match line voltages on a plurality of match lines coupled to the analog CAM memory cells to generate the plurality of search results (1340).

In one embodiment of the application, by adjusting the current sensing level of the sensing amplifier, different match ranges are defined and reliability is compensated.

In the above embodiments of the application, the memory cells may be threshold voltage change memory cells. The threshold voltage change memory cells may be for example but not limited by, charge storage flash memory cells, for example but not limited by, floating-gate memory cells), charge trapping flash memory cells for example but not limited by, SONOS memory cells, MONOS memory cells etc.), split gate flash memory cells, read-only memory (ROM) cells, programmable read-only memory (PROM) cells, erasable programmable Read-Only Memory (EPROM) cells, One Time Programmable Read Only Memory (OTPROM) cells, Electrically-Erasable Programmable Read-Only Memory (EEPROM) cells, ferroelectric-gated field-effect-transistor (FEFET) and so on.

Alternatively, the memory cells may be super steep slope flash memory cells, for example but not limited by, Thyristor RAM (TRAM) cells, Gate control Thyristor (GCT) memory cells, tunnel field-effect transistor (TFET) memory cells, Negative Capacitance-FET (NCFET) memory cells or other super steep slope memory devices.

In the above embodiments of the application, the CAM device may be two-dimension (2D) flash memory structure or 3D flash memory structure (3D NAND flash memory, 3D NOR flash memory, 3D FEFET flash memory), which are still within the spirit and the scope of the application.

The above embodiments of the application may be used in in-memory approximate search. Accompanied by high storage density of the CAM memory device, the in-memory approximate search of the embodiments of the application may be applicable in different field, for example but not limited by, Big-data searching, AI (artificial intelligence) hardware accelerator/classifier, Approximate Computing, Associative memory, Solid-state drive (SSD) data management, deoxyribonucleic acid (DNA) matching, Data filter and so on.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An analog content addressable memory (CAM) device including:
   a plurality of analog CAM cells, the analog CAM cells storing a plurality of analog storage data, wherein the plurality of analog storage data of the analog CAM cells are corresponding to into a plurality of match ranges, the match ranges are determined based on a plurality of first threshold voltages and a plurality of second threshold voltages of the analog CAM cells;
   an electrical characteristic detection circuit coupled to the analog CAM cells; and
   a sensing amplifier, coupled to the analog CAM cells, the match ranges of the analog CAM cells are adjusted by adjusting a current sensing level of the sensing amplifier,
   wherein
   in data searching, an analog search data is converted into a first analog search voltage and a second analog search voltage;
   the first analog search voltage and the second analog search voltage are compared with the match ranges of the analog CAM memory cells, the analog CAM memory cells generate a plurality of memory cell currents, and the electrical characteristic detection circuit detects the memory cell currents to generate a plurality of sensing results, or the electrical characteristic detection circuit detects a plurality of match line voltages on a plurality of match lines coupled to the analog CAM memory cells to generate the plurality of search results.

2. The analog CAM device according to claim 1, wherein the analog CAM cell includes a first and a second memory cells coupled in parallel, the first and the second memory cells having the first threshold voltage and the second threshold voltage, respectively;

the first and the second memory cells receive the first analog search voltage and the second analog search voltage;

the first and the second memory cells are coupled to the match line;

when the first analog search voltage and the second analog search voltage match with the match range, the analog CAM cell generates no memory cell current and the match line voltage of the match line is kept; and when the first analog search voltage and the second analog search voltage does not match with the match range, the analog CAM cell generates the memory cell current and the match line voltage of the match line is discharged.

3. The analog CAM device according to claim 1, wherein the analog CAM cell includes a first and a second memory cells coupled in serial, the first and the second memory cells having the first threshold voltage and the second threshold voltage, respectively;

the first and the second memory cells receive the first analog search voltage and the second analog search voltage;

the first and the second memory cells are coupled to the match line;

when the first analog search voltage and the second analog search voltage match with the match range, the analog CAM cell generates the memory cell current; and when the first analog search voltage and the second analog search voltage does not match with the match range, the analog CAM cell generates no memory cell current.

4. The analog CAM device according to claim 1, wherein a range width and/or a position of the match range is changed by changing the first threshold voltage and the second threshold voltage of the analog CAM cell.

5. The analog CAM device according to claim 1, wherein by changing the first threshold voltage and the second threshold voltage of the analog CAM cell, the match current of the analog CAM cell is adjusted.

6. A data searching and comparing method for an analog content addressable memory (CAM) device, the data searching and comparing method including:

converting an analog search data into a first analog search voltage and a second analog search voltage;

comparing the first analog search voltage and the second analog search voltage with a plurality of match ranges of a plurality of analog CAM memory cells, wherein a plurality of analog storage data of the analog CAM cells are converted into the match ranges, the match ranges are determined based on a plurality of first threshold voltages and a plurality of second threshold voltages of the analog CAM cells;

generating a plurality of memory cell currents from the analog CAM memory cells; and detecting the memory cell currents to generate a plurality of sensing results, or detecting a plurality of match line voltages on a plurality of match lines coupled to the analog CAM memory cells to generate the plurality of search results, wherein the analog CAM cells are coupled to a sensing amplifier, and the match ranges of the analog CAM cells are adjusted by adjusting a current sensing level of the sensing amplifier.

7. The data searching and comparing method for the analog CAM device according to claim 6, wherein the analog CAM cell includes a first and a second memory cells coupled in parallel, the first and the second memory cells having the first threshold voltage and the second threshold voltage, respectively;

the first and the second memory cells receive the first analog search voltage and the second analog search voltage;

the first and the second memory cells are coupled to the match line;

when the first analog search voltage and the second analog search voltage match with the match range, the analog CAM cell generates no memory cell current and the match line voltage of the match line is kept; and when the first analog search voltage and the second analog search voltage does not match with the match range, the analog CAM cell generates the memory cell current and the match line voltage of the match line is discharged.

8. The data searching and comparing method for the analog CAM device according to claim 6, wherein the analog CAM cell includes a first and a second memory cells coupled in serial, the first and the second memory cells having the first threshold voltage and the second threshold voltage, respectively;

the first and the second memory cells receive the first analog search voltage and the second analog search voltage;

the first and the second memory cells are coupled to the match line;

when the first analog search voltage and the second analog search voltage match with the match range, the analog CAM cell generates the memory cell current; and when the first analog search voltage and the second analog search voltage does not match with the match range, the analog CAM cell generates no memory cell current.

9. The data searching and comparing method for the analog CAM device according to claim 6, wherein a range width and/or a position of the match range is changed by changing the first threshold voltage and the second threshold voltage of the analog CAM cell.

10. The data searching and comparing method for the analog CAM device according to claim 6, wherein by changing the first threshold voltage and the second threshold voltage of the analog CAM cell, the match current of the analog CAM cell is adjusted.

11. An analog content addressable memory (CAM) cell including:

a first memory cell and a second memory cell coupled to each other, wherein the analog CAM cell stores analog storage data;

the analog storage data of the analog CAM cell is corresponding to a match range, the match range is determined based on a first threshold voltage and a second threshold voltage of the first memory cell and the second memory cell;

an analog search data is converted into a first analog search voltage and a second analog search voltage;

the first memory cell and the second memory cell receive the first analog search voltage and the second analog search voltage; and the analog CAM memory cell generates a memory cell current, or the analog CAM memory cell keeps or discharges a match line voltage on a match line coupled to the analog CAM memory cell, the analog CAM cell is further coupled to a sensing amplifier, and the match range of the analog CAM cell is adjusted by adjusting a current sensing level of the sensing amplifier.

12. The analog CAM cell according to claim 11, wherein
the first and the second memory cells are coupled in parallel;
the first and the second memory cells are coupled to the match line;
when the first analog search voltage and the second analog search voltage match with the match range, the analog CAM cell generates no memory cell current and the match line voltage of the match line is kept; and
when the first analog search voltage and the second analog search voltage does not match with the match range, the analog CAM cell generates the memory cell current and the match line voltage of the match line is discharged.

13. The analog CAM cell according to claim 11, wherein
the first and the second memory cells are coupled in serial;
the first and the second memory cells are coupled to the match line;
when the first analog search voltage and the second analog search voltage match with the match range, the analog CAM cell generates the memory cell current; and
when the first analog search voltage and the second analog search voltage does not match with the match range, the analog CAM cell generates no memory cell current.

14. The analog CAM cell according to claim 11, wherein a range width and/or a position of the match range is changed by changing the first threshold voltage and the second threshold voltage of the first and the second memory cells.

15. The analog CAM cell according to claim 11, wherein by changing the first threshold voltage and the second threshold voltage of the first and the second memory cells, the match current of the analog CAM cell is adjusted.

* * * * *